(12) United States Patent
Long

(10) Patent No.: US 11,562,997 B2
(45) Date of Patent: Jan. 24, 2023

(54) ELECTROSTATIC PROTECTION CIRCUIT, ARRAY SUBSTRATE AND DISPLAY APPARATUS

(71) Applicant: BOE TECHNOLOGY GROUP CO., LTD., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 509 days.

(21) Appl. No.: 16/609,422

(22) PCT Filed: Jun. 17, 2019

(86) PCT No.: PCT/CN2019/091600
§ 371 (c)(1),
(2) Date: Oct. 29, 2019

(87) PCT Pub. No.: WO2020/015493
PCT Pub. Date: Jan. 23, 2020

(65) Prior Publication Data
US 2020/0144247 A1 May 7, 2020

(30) Foreign Application Priority Data
Jul. 20, 2018 (CN) .......................... 201821161486.7

(51) Int. Cl.
H01L 27/02 (2006.01)
H01L 27/10 (2006.01)
H01L 23/60 (2006.01)

(52) U.S. Cl.
CPC .......... *H01L 27/0288* (2013.01); *H01L 23/60* (2013.01); *H01L 27/0266* (2013.01); *H01L 27/101* (2013.01)

(58) Field of Classification Search
CPC ........................... H01L 23/60; H01L 27/0288
See application file for complete search history.

(56) References Cited

U.S. PATENT DOCUMENTS 5,637,900 A    6/1997  Ker et al.
7,495,878 B2   2/2009  Todd
(Continued)

FOREIGN PATENT DOCUMENTS

CN    101141063 A    3/2008
CN    102118024 A    7/2011
(Continued)

OTHER PUBLICATIONS

Extended European Search Report dated Apr. 25, 2022 from EPO for European application No. 19816491.5.

*Primary Examiner* — Marcos D. Pizarro
(74) *Attorney, Agent, or Firm* — Kinney & Lange, P.A.

(57) ABSTRACT

There are provided an electrostatic protection circuit, an array substrate, and a display apparatus. The electrostatic protection circuit includes: at least one first transistor and at least one second transistor. Each of the first transistors has a gate and a second electrode both connected to an electrostatic protection line, and a first electrode connected to a signal line; and each of the second transistors has a gate and a second electrode both connected to the signal line, and a first electrode connected to the electrostatic protection line. One resistor is connected in series between a gate and a second electrode of at least one transistor in the electrostatic protection circuit.

15 Claims, 4 Drawing Sheets

(56) References Cited

U.S. PATENT DOCUMENTS

| | | | |
|---|---|---|---|
| 7,848,068 B2 | 12/2010 | Chen et al. | |
| 2006/0125054 A1 | 6/2006 | Kim et al. | |
| 2017/0373490 A1* | 12/2017 | Zhu | H01L 27/0255 |
| 2019/0346726 A1* | 11/2019 | Baba | H01L 29/7869 |
| 2020/0144247 A1 | 5/2020 | Long | |

FOREIGN PATENT DOCUMENTS

| | | | |
|---|---|---|---|
| CN | 107039422 A | 8/2017 | |
| CN | 208336227 U | 1/2019 | |

\* cited by examiner

Optional shape of a resistor

ELECTROSTATIC PROTECTION CIRCUIT, ARRAY SUBSTRATE AND DISPLAY APPARATUS

CROSS-REFERENCE TO RELATED APPLICATION(S)

This application is the national phase of PCT Application No. PCT/CN2019/091600 filed on Jun. 17, 2019, which in turn claims priority to the Chinese Patent Application No. 201821161486.7, filed on Jul. 20, 2018, entitled "ELECTROSTATIC PROTECTION CIRCUIT, ARRAY SUBSTRATE AND DISPLAY APPARATUS", each of which is incorporated herein by reference in its entirety.

TECHNICAL FIELD

The present disclosure relates to the field of display technologies, and more particularly, to an electrostatic protection circuit, an array substrate, and a display apparatus.

BACKGROUND

In a process of manufacturing an array substrate, since static electricity is easily generated by processes such as plasma deposition, film etching, and rubbing etc., electrostatic breakdown and electrostatic damage may occur on signal lines formed on the array substrate, which results in a poor array substrate. In order to ensure a normal operation of the respective signal lines, an electrostatic protection device connected to the signal lines may be disposed on the array substrate. The electrostatic protection device is also commonly referred to as an Electro-Static Discharge (ESD) device.

The electrostatic protection device in the related art generally comprises a transistor and an electrostatic protection line, wherein a source of the transistor may be connected to a signal line, and a gate and a drain of the transistor may both be connected to the electrostatic protection line. The transistor may discharge static electricity generated on the signal line to the electrostatic protection line in time.

SUMMARY

The present disclosure provides an electrostatic protection circuit, an array substrate, and a display apparatus.

In an aspect, there is provided an electrostatic protection circuit comprising: at least one first transistor, at least one second transistor, at least one resistor, and an electrostatic protection line, wherein each of the at least one first transistor has a gate and a second electrode both connected to the electrostatic protection line, and a first electrode connected to a signal line;

each of the at least one second transistor has a gate and a second electrode both connected to the signal line, and a first electrode connected to the electrostatic protection line; and one of the at least one resistor is connected in series between a gate and a second electrode of at least one of the at least one first transistor and the at least one second transistor.

In an embodiment, the at least one resistor comprises at least two resistors. Here, a first resistor of the at least two resistors is connected in series between a gate and a second electrode of the at least one first transistor; and a second resistor of the at least two resistors is connected in series between a gate and a second electrode of the at least one second transistor.

In an embodiment, the at least one first transistor comprises two first transistors, the at least one second transistor comprises two second transistors, and the at least one resistor comprises two resistors. A first resistor of the two resistors is connected in series between a gate and a second electrode of one of the two first transistors; and a second resistor of the two resistors is connected in series between a gate and a second electrode of one of the two second transistors.

In an embodiment, the two first transistors are disposed on opposite sides of the signal line respectively; and the two second transistors are disposed on opposite sides of the signal line respectively.

In an embodiment, the at least one first transistor comprises two first transistors, the at least one second transistor comprises two second transistors, and the at least one resistor comprises four resistors. Each of the four resistors is connected in series between a gate and a second electrode of each of the two first transistors and the two second transistors, respectively.

In an embodiment, the electrostatic protection line comprises: a first discharging line and a second discharging line. Signals provided by the first discharging line and the second discharging line are at different potentials; and a gate and a second electrode of each of the at least one first transistor are connected to the first discharging line, and a first electrode of each of the at least one second transistor is connected to the second discharging line.

In an embodiment, the potential of the signal provided by the first discharging line is at a high potential with respect to the potential of the signal provided by the second discharging line, and each of the transistors is a P-type transistor.

In an embodiment, the potential of the signal provided by the first discharging line is a low potential with respect to the potential of the signal provided by the second discharging line, and each of the transistors is an N-type transistor.

In an embodiment, the electrostatic protection line is a common electrode line.

In an embodiment, each of the transistors is a thin film transistor; and each of the resistors is disposed in the same layer as that of an active layer of the thin film transistor.

In an embodiment, each of the resistors and the active layer are made of a polysilicon material.

In an embodiment, each of the resistors has a serpentine shape, a zigzag shape, or an arc shape.

In an embodiment, the signal line is a data line; and a first electrode and a second electrode of each of the at least one first transistor and the at least one second transistor are disposed in the same layer as that of the signal line.

In an embodiment, a gate of each of the transistors is disposed in the same layer as that of the electrostatic protection line; and a second electrode of each of the first transistors is connected to the electrostatic protection line through a via hole, a first electrode of each of the second transistors is connected to the electrostatic protection line through a via hole, and each of the resistors is connected to a gate and a second electrode of a transistor through via holes respectively.

In an embodiment, the signal line is a gate line; and a gate of each of the at least one first transistor and the at least one second transistor is disposed in the same layer as that of the signal line, and a first electrode and a second electrode of each of the at least one first transistor and the at least one second transistor are disposed in the same layer as that of the electrostatic protection line.

In an embodiment, the electrostatic protection line comprises: a first discharging line and a second discharging line, wherein signals provided by the first discharging line and the second discharging line are at different potentials; and a gate and a second electrode of each of the first transistors are connected to the first discharging line, and a first electrode of each of the second transistors is connected to the second discharging line.

Each of the transistors is a thin film transistor, each of the resistors is disposed in the same layer as that of the active layer of the thin film transistor, each of the resistors and the active layer are made of a polysilicon material, and each of the resistors has one of a serpentine shape, a zigzag shape, and an arc shape; and the signal line is a data line, a first electrode and a second electrode of each of the transistors are disposed in the same layer as that of the signal line, a gate of each of the transistors is disposed in the same layer as that of the electrostatic protection line, a second electrode of each of the first transistors is connected to the electrostatic protection line through a via hole, a first electrode of each of the second transistors is connected to the electrostatic protection line through a via hole, and each of the resistors is connected to a gate and a second electrode of a transistor through via holes respectively.

In another aspect, there is provided an array substrate comprising: the electrostatic protection circuit in the above aspect.

In yet another aspect, there is provided a display apparatus comprising the array substrate in the above aspect.

BRIEF DESCRIPTION OF THE ACCOMPANYING DRAWINGS

In order to more clearly illustrate the technical solutions according to the embodiments of the present disclosure, the accompanying drawings required to be used in the description of the embodiments will be briefly described below. It is obvious that the accompanying drawings in the following description are only some embodiments of the present disclosure. Other accompanying drawings may also be obtained by those of ordinary skill in the art according to these accompanying drawings without any creative work.

DETAILED DESCRIPTION

In order to make the purposes, technical solutions and advantages of the present disclosure more clear, the embodiments of the present disclosure will be further described in detail below with reference to the accompanying drawings.

Transistors used in the embodiments of the present disclosure may all be thin film transistors, and the transistors used in the embodiments of the present disclosure are mainly switching transistors according to functions thereof in a circuit. Since a source and a drain of a switching transistor used here are symmetrical, the source and the drain of the switching transistor are interchangeable. In the embodiments of the present disclosure, the source may be referred to as a first electrode, and the drain may be referred to as a second electrode; or the source may be referred to as a second electrode, and the drain may be referred to as a first electrode. According to a form in the accompanying drawing, it may be defined that an intermediate terminal of the transistor is the gate, a signal input terminal is the source, and a signal output terminal is the drain.

Figure 1:
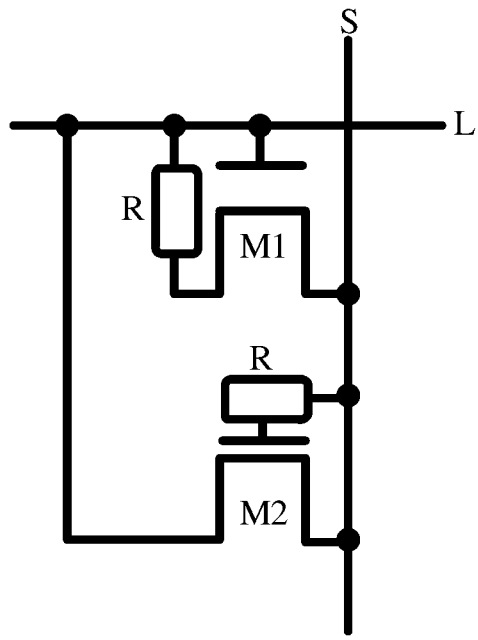
FIG. 1 is an equivalent circuit diagram of an electrostatic protection circuit according to an embodiment of the present disclosure.

FIG. 1 is an equivalent circuit diagram of an electrostatic protection circuit according to an embodiment of the present disclosure. As shown in FIG. 1, the electrostatic protection circuit may comprise at least one first transistor M1, at least one second transistor M2, at least one resistor R, and an electrostatic protection line L.

Each of the at least one first transistor M1 has a gate and a second electrode both connected to the electrostatic protection line L, and a first electrode connected to a signal line S.

Each of the at least one second transistor M2 has a gate and a second electrode both connected to the signal line, and a first electrode connected to the electrostatic protection line L.

A resistor R is connected in series between a gate and a second electrode of at least one of the at least one first transistor M1 and the at least one second transistor M2.

For example, the electrostatic protection circuit shown in FIG. 1 comprises one first transistor M1, one second transistor M2, and two resistors R, and a resistor R is connected in series between a gate and a second electrode of each of the transistors.

Here, the signal line S may be any of signal lines on an array substrate, for example, may be any signal line for driving a display apparatus, such as a data line, a gate line or a clock signal line of a gate driving circuit etc. Alternatively, the signal line may also be a test line or a repair line etc. in the array substrate.

The electrostatic protection line L may be a discharging line for providing a reference power supply signal. For example, the electrostatic protection line L may be a common electrode (Vcom) line for providing a common electrode signal having a potential of 0 volts (V) or about 0 volts. When static electricity is generated on the signal line S, the at least one first transistor M1 or the at least one second transistor M2 may be turned on, so that the signal line S may be connected to the electrostatic protection line L, to enable the static electricity generated on the signal line S to be released to the electrostatic protection line L.

In the embodiment of the present disclosure, a resistor R is connected in series between a gate and a second electrode of at least one transistor of the at least one first transistor M1 and the at least one second transistor M2, and therefore, when there is a lot of charges instantaneously accumulated on the signal line S, the resistor R may effectively reduce current flowing between the gate and the second electrode of the transistor to prevent the transistor from being burned out, thereby reducing the probability of failure of the electrostatic protection circuit, and improving the reliability of the electrostatic protection circuit.

In the embodiment of the present disclosure, the resistor R may also function as a bleeder resistor to protect the gate and the drain (i.e., the second electrode) of the transistor. Since a resistance value between the gate and the drain of the transistor is large, only a small amount of static electricity may cause a high voltage across an equivalent capacitor between the gate and the drain. If the small amount of static electricity is not discharged in time, the high voltage across the equivalent capacitor may cause the transistor to malfunction and may even break down the gate and the drain of the transistor. In the embodiment of the present disclosure, the resistor R is connected in series between the gate and the drain, and therefore the resistor R may discharge the static electricity, thereby functioning as a protection transistor.

It should be illustrated that when the electrostatic protection circuit comprises one first transistor M1 and one second transistor M2, the electrostatic protection circuit has a simple structure and a small occupied area. When the electrostatic protection circuit comprises a plurality of first transistors M1 and a plurality of second transistors M2, if a certain one of the first transistors M1 or a certain one of the second transistors M2 fails, the other transistors may further ensure that the electrostatic protection circuit operates normally, and therefore may effectively improve the reliability of the electrostatic protection circuit. In the embodiment of the present disclosure, a number of the first transistors M1 and a number of the second transistors M2 in the electrostatic protection circuit may be flexibly selected according to the application requirements, which is not limited in the embodiment of the present disclosure.

In summary, the embodiments of the present disclosure provide an electrostatic protection circuit in which a resistor is connected in series between a gate and a second electrode of at least one transistor, and therefore when large current is generated on the signal line, the resistor may effectively reduce the current flowing between the gate and the second electrode of the transistor to prevent the transistor from being burned out, thereby effectively reducing the probability of failure of the electrostatic protection circuit and improving the reliability of the electrostatic protection circuit.

In an embodiment, the electrostatic protection circuit may comprise at least two resistors R.

One resistor R is connected in series between the gate and the second electrode of the at least one first transistor M1; and one resistor R is connected in series between the gate and the second electrode of the at least one second transistor M2.

For example, as shown in FIG. 1, the electrostatic protection circuit may comprise two resistors R, wherein one resistor R is connected in series between the gate and the second electrode of the first transistor M1, and the other resistor R is connected in series between the gate and the second electrode of the second transistor M2.

Assuming that each of the transistors included in the electrostatic protection circuit is a P-type transistor, when high-voltage static electricity is generated on the signal line S, a potential at the gate of the first transistor M1 is less than that at the first electrode of the first transistor M1. At this time, the first transistor M1 is turned on to connect the signal line S to the electrostatic protection line L, and the signal line S may be discharged to the electrostatic protection line L through the first transistor M1. When low-voltage static electricity is generated on the signal line S, a potential at the gate of the second transistor M2 is less than that at the first electrode of the second transistor M2. At this time, the second transistor M2 is turned on to connect the signal line S to the electrostatic protection line L, and the signal line S may be discharged to the electrostatic protection line L through the second transistor M2.

It may be seen from the above analysis that, one resistor R is connected in series between the gate and the second electrode of the at least one first transistor M1 and one resistor R is connected in series between the gate and the second electrode of the at least one second transistor M2, so that no matter whether high-voltage static electricity or low-voltage static electricity is generated on the signal line, the transistor which is in a turn-on state may reduce the current flowing through the transistor through the resistor which is connected in series, to prevent the transistor from being burned out, thereby improving the reliability of the electrostatic protection circuit.

Figure 2:
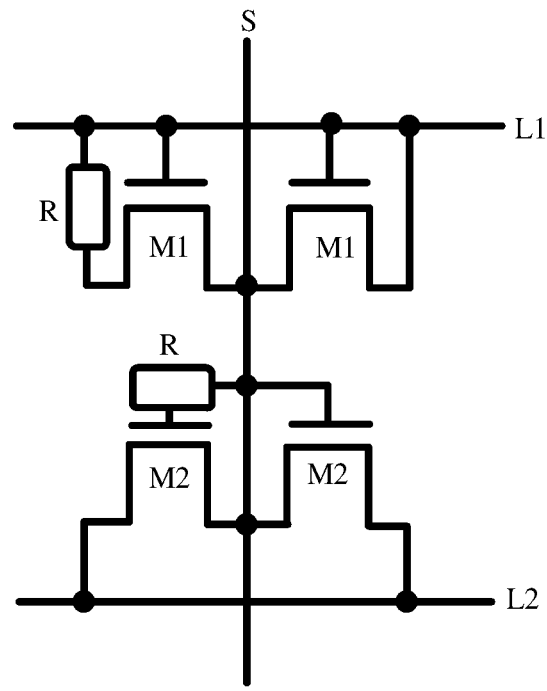
FIG. 2 is an equivalent circuit diagram of another electrostatic protection circuit according to an embodiment of the present disclosure.

In an embodiment, FIG. 2 is an equivalent circuit diagram of another electrostatic protection circuit according to an embodiment of the present disclosure. As shown in FIG. 2, the electrostatic protection circuit may comprise two first transistors M1, two second transistors M2, and two resistors R.

One of the two resistors R is connected in series between a gate and a second electrode of one of the first transistors M1, and the other of the two resistors R is connected in series between a gate and a second electrode of one of the second transistors M2.

In the structure shown in FIG. 2, there is no resistor connected in series between a gate and a second electrode of one of the two first transistors M1. There is no resistor connected in series between a gate and a second electrode of one of the two second transistors M2. When static electricity with a relative small voltage is generated on a signal line S, that is, when small instantaneous current is generated on the signal line S, the transistor which is not connected in series to a resistor may realize rapid discharging of the static electricity, that is, electrostatic charges accumulated on the signal line in a case of a small voltage may be quickly released.

Figure 3:
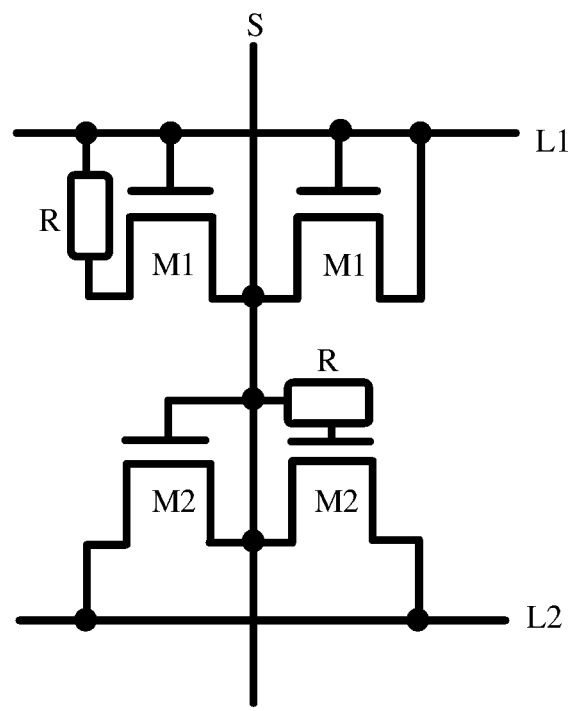
FIG. 3 is an equivalent circuit diagram of yet another electrostatic protection circuit according to an embodiment of the present disclosure.

FIG. 3 is an equivalent circuit diagram of yet another electrostatic protection circuit according to an embodiment of the present disclosure. It may be seen by comparing FIG. 2 with FIG. 3 that, one of the two first transistors M1 which is connected in series to a resistor and one of the two first transistors M1 which is not connected in series to a resistor may be disposed on both sides of a signal line S respectively, for example, the first transistor M1 which is connected in series to a resistor may be disposed on a left side of the signal line S, and the first transistor M1 which is not connected in series to a resistor may be disposed on a right side of the signal line S. Similarly, one of the two second transistors M2 which is connected in series to a resistor and one of the two second transistors M2 which is not connected in series to a resistor may be disposed on both sides of the signal line S respectively, for example, the second transistor M2 which is connected in series to a resistor may be disposed on a right side of the signal line S, and the second transistor M2 which is not connected in series to a resistor may be disposed on a left side of the signal line S. An orientation in which the transistors are disposed is not limited in the embodiment of the present disclosure.

Figure 4:
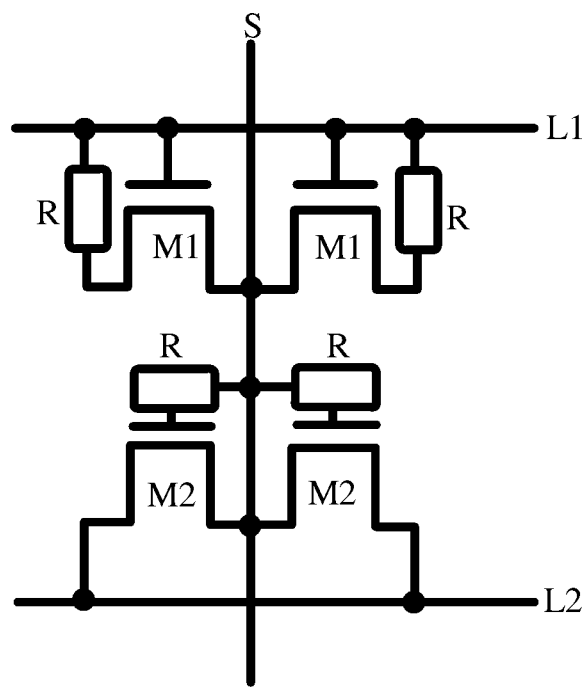
FIG. 4 is an equivalent circuit diagram of still another electrostatic protection circuit according to an embodiment of the present disclosure.

In an embodiment, FIG. 4 is an equivalent circuit diagram of still another electrostatic protection circuit according to an embodiment of the present disclosure. As shown in FIG. 4, the electrostatic protection circuit may comprise two first transistors M1, two second transistors M2, and four resistors R. Here, a resistor R may be connected in series between a gate and a second electrode of each of the transistors.

Two first transistors M1 and two second transistors M2 are disposed in the electrostatic protection circuit and one resistor R is connected in series between a gate and a second electrode of each of the transistors, so that a problem that the electrostatic protection circuit may not operate normally when a certain transistor or a certain resistor fails, which improves the reliability of the electrostatic protection circuit, and ensures the antistatic performance of the electrostatic protection circuit.

In an implementation, as shown in FIGS. 2 to 4, the electrostatic protection line L may comprise: a first discharging line L1 and a second discharging line L2, wherein signals provided by the first discharging line L1 and the second discharging line L2 are at different potentials.

As shown in FIGS. 2 to 4, a gate and a second electrode of each of the first transistors M1 are connected to the first discharging line L1, and a first electrode of each of the second transistors M2 is connected to the second discharging line L2.

In an embodiment, if the potential of the signal provided by the first discharging line L1 is a high potential relative to the potential of the signal provided by the second discharging line L2, each of the transistors may be a P-type transistor.

For example, the signal provided by the first discharging line L1 may be a VGH signal, the signal provided by the second discharging line L2 may be a VGL signal, the potential of the VGH signal may be about 10V, and the potential of the VGL signal may be about −10V. A gate-source potential difference Vgs (which may also be referred to as a gate-source voltage) of the transistor satisfies: Vgs=Vg−Vs (i.e., a difference between a potential Vg at the gate and a potential Vs of the source). For a P-type transistor, when Vgs<Vth, the transistor is turned on, wherein Vth is a threshold voltage of the transistor. Since Vth of the P-type transistor is generally less than or equal to 0, the P-type transistor may be turned on when the potential Vg at the gate is less than the potential Vs at the first electrode. Therefore, when high-voltage static electricity is generated on the signal line S, each of the first transistors M1 is turned on to connect the signal line S to the first discharging line L1. At this time, the signal line S may discharge the static electricity to the first discharging line L1. When low-voltage static electricity is generated on the signal line S, each of the second transistors M2 is turned on to connect the signal line S to the second discharging line L2. At this time, the signal line S may discharge the static electricity to the second discharging line L2.

In an embodiment, if the potential of the signal provided by the first discharging line L1 is a low potential with respect to the potential of the signal provided by the second discharging line L2, each of the transistors is an N-type transistor.

For example, the signal provided by the first discharging line L1 may be a VGL signal, and the signal provided by the second discharging line L2 may be a VGH signal. For an N-type transistor, when Vgs>Vth, the transistor is turned on. Since Vth of the N-type transistor is generally greater than or equal to 0, the N-type transistor may be turned on when the potential Vg at the gate is greater than the potential Vs at the first electrode. Therefore, when high-voltage static electricity is generated on the signal line S, each of the second transistors M2 is turned on to connect the signal line S to the second discharging line L2. At this time, the signal line S may discharge the static electricity to the second discharging line L2. When low-voltage static electricity is generated on the signal line S, each of the first transistors M1 is turned on to connect the signal line S to the first discharging line L1. At this time, the signal line S may discharge the static electricity to the first discharging line L1.

In another implementation, as shown in FIG. 1, the electrostatic protection line L may also be a common electrode line. The common electrode line may provide a common electrode signal having a potential of 0V or about 0V. At this time, each of the transistors in the electrostatic protection circuit may be a P-type transistor, or may also be an N-type transistor.

As described above, if each transistor is a P-type transistor, each of the first transistors M1 may be turned on when high-voltage static electricity is generated on the signal line S; and each of the second transistors M2 may be turned on when low-voltage static electricity is generated on the signal line S. If each transistor is an N-type transistor, each of the second transistors M2 may be turned on when high-voltage static electricity is generated on the signal line S; and each of the first transistors M1 may be turned on when low-voltage static electricity is generated on the signal line S.

Figure 5:
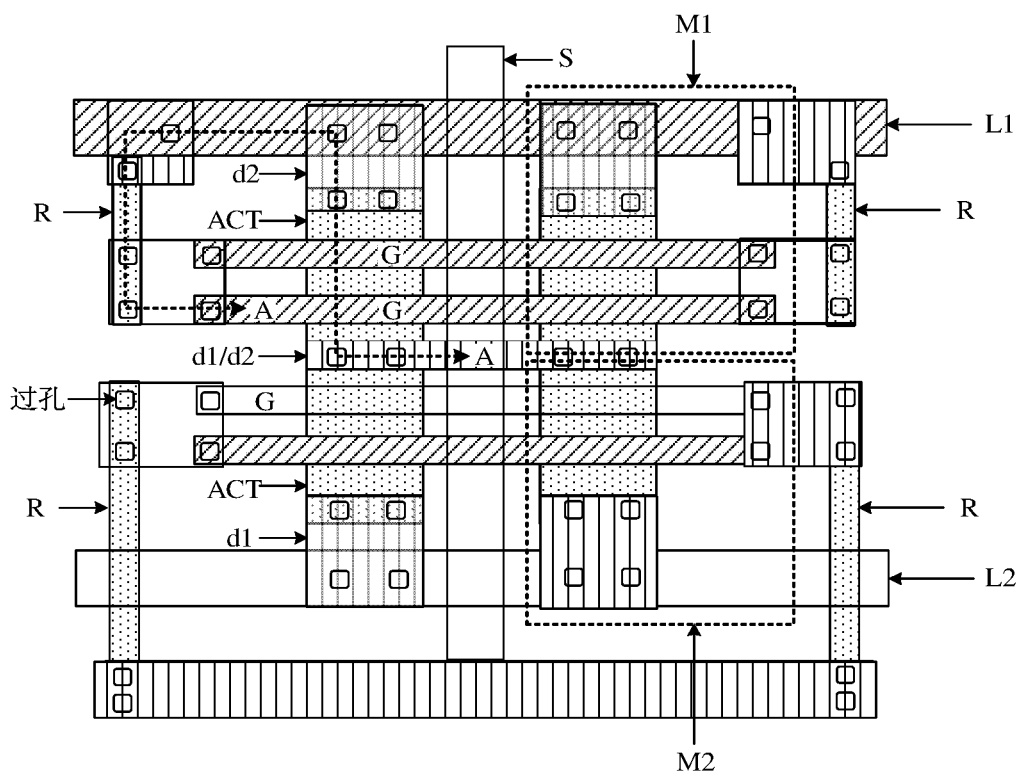
FIG. 5 is a top plan view of an electrostatic protection circuit according to an embodiment of the present disclosure.
Figure 6:
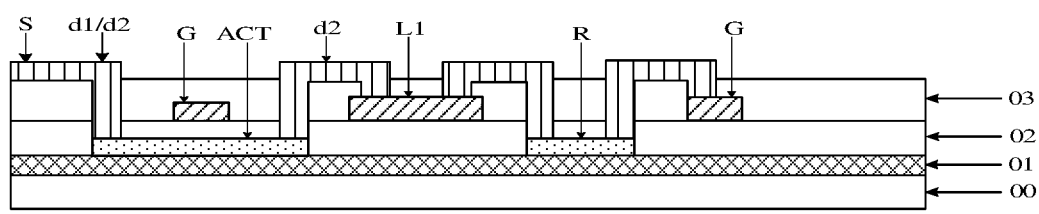
FIG. 6 is a cross-sectional view of FIG. 5 in an AA direction.

FIG. 5 is a top plan view of an electrostatic protection circuit according to an embodiment of the present disclosure, and FIG. 6 is a cross-sectional view of FIG. 5 in an AA direction. As shown in FIGS. 5 and 6, each of transistors in the electrostatic protection circuit may be a thin film transistor formed on a base substrate. Each of resistors R may be disposed in the same layer as that of an active layer ACT of the thin film transistor.

In an embodiment, each of the resistors R and the active layer may be made of a polysilicon material, for example, a low temperature polysilicon material. The polysilicon material has a moderate resistance, that is, the polysilicon material may not only resist an impact of large current, but also may ensure rapid release of static electricity.

By way of example, each resistor may be made of an undoped polysilicon material or may also be made of a doped polysilicon material. An active layer of each transistor may be made of a doped polysilicon material. When the transistors used in the electrostatic protection circuit are N-type transistors, the material doped in the polysilicon may be phosphorus, arsenic, antimony, sulfur, selenium or tellurium, etc., wherein phosphorus, arsenic or selenium is generally used. When the transistors used in the electrostatic protection circuit are P-type transistors, the material doped in the polysilicon may be boron, aluminum, gallium or beryllium, etc., wherein boron is generally used.

In the embodiment of the present disclosure, if the signal line S is a data line for transmitting a data signal in the array substrate, it may be seen in combination with FIGS. 5 and 6 that a first electrode d1 and a second electrode d2 of each transistor may be disposed in the same layer as that of the signal line S. Further, a gate G of each transistor may be disposed in the same layer as that of the electrostatic protection line (for example, a first discharging line L1 and a second discharging line L2 shown in the figures). It may also be seen from FIG. 5 that the first electrode d1 of the first transistor M1 and the second electrode d2 of the second transistor M2 may share the same electrode.

As shown in FIG. 5, the second electrode d2 of each of the first transistors may be connected to the electrostatic protection line L (for example, the first discharging line L1) through a via hole. The first electrode d1 of each of the second transistors may also be connected to the electrostatic protection line L (for example, the second discharging line L2) through a via hole. Each of the resistors R may be connected to a gate G and a second electrode d2 of a transistor through via holes respectively.

In an embodiment, if the signal line S is a gate line, the gate G of each transistor may be disposed in the same layer as that of the signal line S, and the first electrode d1 and the second electrode d2 of each transistor may be disposed in a different layer from that of the signal line S, and may be connected to the signal line S through via holes respectively.

It should be illustrated that, if the signal line S is a gate line, the electrostatic protection line L may be disposed in the same layer as that of the first electrode d1 and the second electrode d2 of the transistor.

It may also be seen with reference to FIG. 6 that the electrostatic protection circuit may be disposed on a base substrate 00 on which a buffer layer 01 is formed. A gate insulating layer 02 is disposed on one side of the active layer ACT of the thin film transistor away from the base substrate 00, and a gate G of the thin film transistor and an electrostatic protection line may be disposed on one side of the gate insulating layer 02 away from the base substrate 00. An interlayer dielectric layer 03 is further disposed on one side of the gate G and the electrostatic protection line away from the base substrate 00, and the first electrode d1 and the second electrode d2 of the thin film transistor and the signal line S may be disposed on one side of the interlayer dielectric layer 03 away from the base substrate 00.

Figure 7:
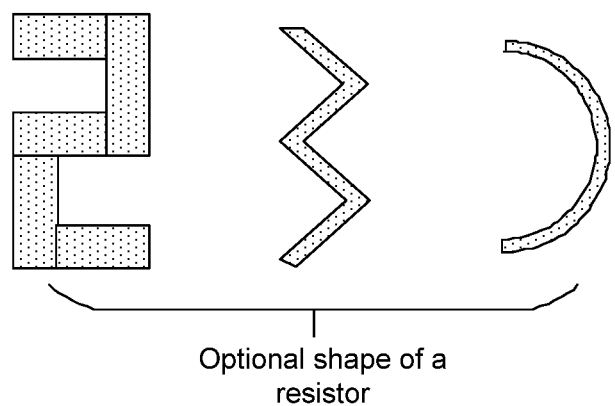
FIG. 7 is a schematic diagram of an alternative shape of a resistor according to an embodiment of the present disclosure.

FIG. 7 is a schematic diagram of an optional shape of a resistor according to an embodiment of the present disclosure. As shown in FIG. 7, each resistor R in the electrostatic protection circuit may have a serpentine shape, a zigzag shape or an arc shape etc. This makes it possible to increase resistance of each resistor R as much as possible within a limited wiring space. Here, the shape of the resistor may refer to a shape of an orthographic projection of the resistor on the base substrate.

In summary, the embodiments of the present disclosure provide an electrostatic protection circuit in which a resistor is connected in series between a gate and a second electrode of at least one transistor, and therefore when large current is generated on the signal line, the resistor may effectively reduce the current flowing between the gate and the second electrode of the transistor to prevent the transistor from being burned out, thereby effectively reducing the probability of failure of the electrostatic protection circuit and improving the reliability of the electrostatic protection circuit.

The embodiments of the present disclosure provide a method for manufacturing an electrostatic protection circuit, which may be used to manufacture the electrostatic protection circuit according to the above embodiments. The method may comprise the following steps.

In step 101, at least one first transistor, at least one second transistor, at least one resistor, and an electrostatic protection line are formed on a base substrate.

Here, a gate and a second electrode of each of the at least one first transistor are connected to the electrostatic protection line, and a first electrode of each of the at least one first transistor is connected to the signal line. A gate and a second electrode of each of the at least one second transistor are connected to the signal line, and a first electrode of each of the at least one second transistor is connected to the electrostatic protection line. Further, a resistor is connected in series between a gate and a second electrode of at least one of the at least one first transistor and the at least one second transistor.

In an embodiment, when resistors are formed on the base substrate, at least two resistors may be formed, and a resistor may be connected in series between the gate and the second electrode of the at least one first transistor, and a resistor may be connected in series between the gate and the second electrode of the at least one second transistor.

In an embodiment, when transistors and resistors are formed on the base substrate, two first transistors, two second transistors, and two resistors may be formed. Further, one of the two resistors may be connected in series between a gate and a second electrode of one of the first transistors, and the other resistor may be connected in series between a gate and a second electrode of one of the second transistors.

In an embodiment, when transistors and resistors are formed on the base substrate, two first transistors, two second transistors, and four resistors may be formed. Further, a resistor may be connected in series between a gate and a second electrode of each of the transistors.

As an implementation, the electrostatic protection line formed on the base substrate may comprise: a first discharging line and a second discharging line, wherein signals provided by the first discharging line and the second discharging line are at different potentials. Here, a gate and a second electrode of each of the first transistors are connected to the first discharging line, and a first electrode of each of the second transistors is connected to the second discharging line.

In an embodiment, the potential of the signal provided by the first discharging line may be a high potential with respect to the potential of the signal provided by the second discharging line, and each transistor may be a P-type transistor. Alternatively, the potential of the signal provided by the first discharging line may be a low potential with respect to the potential of the signal provided by the second discharging line, and each transistor may be an N-type transistor.

As another implementation, the electrostatic protection line formed on the base substrate may be a common electrode line.

In the embodiment of the present disclosure, each of the transistors formed on the base substrate may be a thin film transistor. When the at least one resistor is formed on the base substrate, the at least one resistor may be formed using a one-time patterning process together with the active layer of the thin film transistor. This may avoid increasing the process complexity in the manufacturing of the electrostatic protection circuit.

In an embodiment, if the signal line is a data line, in the above step 101, a gate of each transistor and the electrostatic protection line may be formed using a one-time patterning process, and a first electrode and a second electrode of each transistor and the signal line may be formed using a one-time patterning process. Correspondingly, a second electrode of each first transistor may be connected to the electrostatic protection line through a via hole, a first electrode of each second transistor may be connected to the electrostatic protection line through a via hole, and each resistor may be connected to a gate and a second electrode of a transistor through via holes respectively.

Here, the one-time patterning process may comprise processes such as photoresist coating, exposure, development, etching, and photoresist glass etc.

In the embodiment of the present disclosure, the gate, the first electrode and the second electrode of the transistor and the electrostatic protection line may all be formed of a metal material. The metal material may comprise any of copper (Cu), aluminum (Al), titanium (Ti), molybdenum (Mo), molybdenum-niobium alloy (MoNb), and aluminum-niobium alloy (AlNd). Further, when any of the gate, the first electrode and the second electrode of the transistor and the electrostatic protection line is formed, a metal thin film may be firstly deposited on a surface of the base substrate using a magnetron sputtering process; and then the metal thin film may be patterned using a one-time patterning process to obtain corresponding elements.

In addition, when the resistor and the active layer of the transistor are formed, a polysilicon film may be firstly formed on the surface of the base substrate; and then the polysilicon film may be patterned using a one-time patterning process to obtain a resistor and an active layer.

Here, the process of forming a polysilicon film may comprise: firstly depositing an amorphous silicon film using a Plasma Enhanced Chemical Vapor Deposition (PECVD) process, and then processing the amorphous silicon film using an Excimer Laser Annealing (ELA) method to obtain a polysilicon film. Alternatively, the polysilicon film may be directly formed in a high temperature environment of 900 degrees or higher using a Low Pressure Chemical Vapor Deposition (LPCVD) process.

Figure 8:
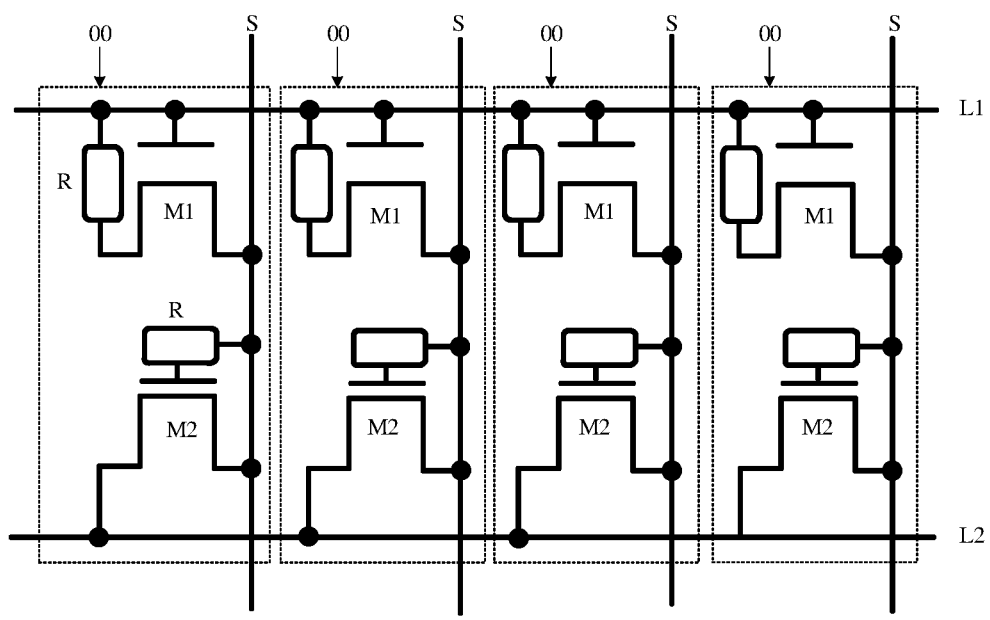
FIG. 8 is a schematic structural diagram of an array substrate according to an embodiment of the present disclosure.

FIG. 8 is a schematic structural diagram of an array substrate according to an embodiment of the present disclosure. As shown in FIG. 8, the array substrate may comprise: signal lines S and electrostatic protection circuits 00 connected to the respective signal lines S. Each of the electrostatic protection circuits 00 may be the electrostatic protection circuit as shown in any of FIGS. 1 to 6.

In an embodiment, it may be seen from FIG. 8 that, the array substrate may comprise the plurality of signal lines S, wherein each of the signal lines S may be connected to one electrostatic protection circuit 00 as shown in any of FIGS. 1 to 6.

In the embodiment of the present disclosure, the electrostatic protection circuits 00 connected to the respective signal lines S may be disposed in a non-display area around the array substrate.

The embodiments of the present disclosure further provide a display apparatus, which may comprise the array substrate as shown in FIG. 8. The display apparatus may be any product or component having a display function such as a liquid crystal panel, an electronic paper, an OLED panel, an AMOLED panel, a mobile phone, a tablet computer, a television, a display, a notebook computer, a digital photo frame, a navigator, etc.

The above description is only exemplary embodiments of the present disclosure, and is not intended to limit the present disclosure. Any modifications, equivalent substitutions, improvements, etc., made within the spirit and principles of the present disclosure should be included in the protection scope of the present disclosure.

I claim:

1. An electrostatic protection circuit comprising: at least one first transistor, at least one second transistor, at least one resistor, and an electrostatic protection line, wherein
    each of the at least one first transistor has a gate and a second electrode both connected to the electrostatic protection line, and a first electrode connected to a signal line;
    each of the at least one second transistor has a gate and a second electrode both connected to the signal line, and a first electrode connected to the electrostatic protection line; and
    one of the at least one resistor is connected in series between a gate and a second electrode of at least one of the at least one first transistor and the at least one second transistor,
    wherein the at least one resistor comprises at least two resistors, wherein:
        a first resistor of the at least two resistors is connected in series between a gate and a second electrode of the at least one first transistor; and
        a second resistor of the at least two resistors is connected in series between a gate and a second electrode of the at least one second transistor;
    wherein the at least one first transistor comprises two first transistors, the at least one second transistor comprises two second transistors, and the at least one resistor comprises two resistors comprising the first resistor and the second resistor, wherein:
        the first resistor is connected in series between a gate and a second electrode of one of the two first transistors; and
        the second resistor is connected in series between a gate and a second electrode of one of the two second transistors;
    wherein the two first transistors are disposed on opposite sides of the signal line respectively; and
    wherein the two second transistors are disposed on opposite sides of the signal line respectively.

2. The electrostatic protection circuit according to claim 1, wherein the at least one first transistor comprises two first transistors, the at least one second transistor comprises two second transistors, and the at least one resistor comprises four resistors, wherein
    each of the four resistors is connected in series between a gate and a second electrode of each of the two first transistors and the two second transistors, respectively.

3. The electrostatic protection circuit according to claim 1, wherein the electrostatic protection line is a common electrode line.

4. The electrostatic protection circuit according to claim 1, wherein the signal line is a gate line; and
    a gate of each of the at least one first transistor and the at least one second transistor is disposed in the same layer as that of the signal line, and a first electrode and a second electrode of each of the at least one first transistor and the at least one second transistor are disposed in the same layer as that of the electrostatic protection line.

5. The electrostatic protection circuit according to claim 1, wherein the electrostatic protection line comprises a first discharging line and a second discharging line, wherein signals provided by the first discharging line and the second discharging line are at different potentials; and wherein:
    a gate and a second electrode of each of the first transistors are connected to the first discharging line, and a first electrode of each of the second transistors is connected to the second discharging line;
    each of the transistors is a thin film transistor, each of the resistors is disposed in the same layer as that of the active layer of the thin film transistor, each of the resistors and the active layer are made of a polysilicon material, and each of the resistors has one of a serpentine shape, a zigzag shape, and or an arc shape; and
    the signal line is a data line, a first electrode and a second electrode of each of the transistors are disposed in the same layer as that of the signal line, a gate of each of the transistors is disposed in the same layer as that of the electrostatic protection line, a second electrode of each of the first transistors is connected to the electrostatic protection line through first via holes, a first electrode of each of the second transistors is connected to the electrostatic protection line through second via holes, and each of the resistors is connected to a gate and a second electrode of a transistor through third via holes respectively.

6. The electrostatic protection circuit according to claim 1, wherein the signal line is a data line; and
   a first electrode and a second electrode of each of the at least one first transistor and the at least one second transistor are disposed in the same layer as that of the signal line.

7. The electrostatic protection circuit according to claim 6, wherein a gate of each of the at least one first transistor and the at least one second transistor is disposed in the same layer as that of the electrostatic protection line; and
   a second electrode of each of the at least one first transistor is connected to the electrostatic protection line through a first via hole, and a first electrode of each of the at least one second transistor is connected to the electrostatic protection line through a second via hole.

8. An array substrate comprising:
   the electrostatic protection circuit according to claim 1.

9. A display apparatus comprising the array substrate according to claim 8.

10. The electrostatic protection circuit according to claim 1, wherein the electrostatic protection line comprises a first discharging line and a second discharging line, wherein signals provided by the first discharging line and the second discharging line are at different potentials; and
   wherein a gate and a second electrode of each of the at least one first transistor are connected to the first discharging line, and a first electrode of each of the at least one second transistor is connected to the second discharging line.

11. The electrostatic protection circuit according to claim 10, wherein
   the potential of the signal provided by the first discharging line is a high potential with respect to the potential of the signal provided by the second discharging line, and each of the transistors is a P-type transistor.

12. The electrostatic protection circuit according to claim 10, wherein
   the potential of the signal provided by the first discharging line is a low potential with respect to the potential of the signal provided by the second discharging line, and each of the transistors is an N-type transistor.

13. The electrostatic protection circuit according to claim 1, wherein each of the transistors is a thin film transistor; and
   each of the resistors is disposed in the same layer as that of an active layer of the thin film transistor.

14. The electrostatic protection circuit according to claim 13, wherein
   each of the resistors and the active layer are made of a polysilicon material.

15. The electrostatic protection circuit according to claim 13, wherein
   each of the resistors has one of a serpentine shape, a zigzag shape, and or an arc shape.

* * * * *